(12) United States Patent
Kim et al.

(10) Patent No.: US 7,713,092 B2
(45) Date of Patent: May 11, 2010

(54) BACKLIGHT ASSEMBLY, DISPLAY DEVICE HAVING THE SAME, AND METHOD THEREOF

(75) Inventors: Gi-Cherl Kim, Yongin-si (KR); Joo-Woan Cho, Seoul (KR); Sang-Gil Lee, Seoul (KR); Don-Chan Cho, Seongnam-si (KR); Sang-Yu Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/455,355

(22) Filed: Jun. 19, 2006

(65) Prior Publication Data

US 2006/0289201 A1 Dec. 28, 2006

(30) Foreign Application Priority Data

Jun. 22, 2005 (KR) .................. 10-2005-0054002

(51) Int. Cl.
*H01R 24/00* (2006.01)
(52) U.S. Cl. ................... 439/660; 439/284; 439/290
(58) Field of Classification Search ............. 439/56, 439/61, 62, 289, 284, 290
See application file for complete search history.

(56) References Cited

U.S. PATENT DOCUMENTS 5,920,465 A 7/1999 Tanaka

| | | | |
|---|---|---|---|
| 6,942,492 B2 * | 9/2005 | Alvarez et al. | 439/65 |
| 2006/0139932 A1 * | 6/2006 | Park | 362/294 |
| 2007/0155194 A1 * | 7/2007 | Vega Martinez | 439/62 |

FOREIGN PATENT DOCUMENTS

| | | |
|---|---|---|
| CN | 2558188 | 6/2003 |
| CN | 1531387 | 9/2004 |
| CN | 1560672 | 1/2005 |
| JP | 2001-237008 | 8/2001 |
| JP | 2002-50843 | 2/2002 |
| JP | 2003-243792 | 8/2003 |
| JP | 2004327605 | 11/2004 |
| KR | 2000-0032323 | 6/2000 |
| KR | 10-2001-0039659 | 5/2001 |
| KR | 2003-0067449 | 8/2003 |
| KR | 10-2004-0046484 | 6/2004 |
| KR | 10-2004-0072768 | 8/2004 |

* cited by examiner

*Primary Examiner*—Tho D Ta
*Assistant Examiner*—Travis Chambers
(74) *Attorney, Agent, or Firm*—Cantor Colburn LLP

(57) ABSTRACT

A backlight assembly and a display device having the backlight assembly are provided where the backlight assembly includes a plurality of light sources for emitting light and a plurality of metal core printed circuit boards on which the light sources are mounted. The metal core printed circuit boards are directly connected to each other in predetermined regions to emit light in a surface direction. A method of assembling the backlight assembly is further provided.

29 Claims, 13 Drawing Sheets

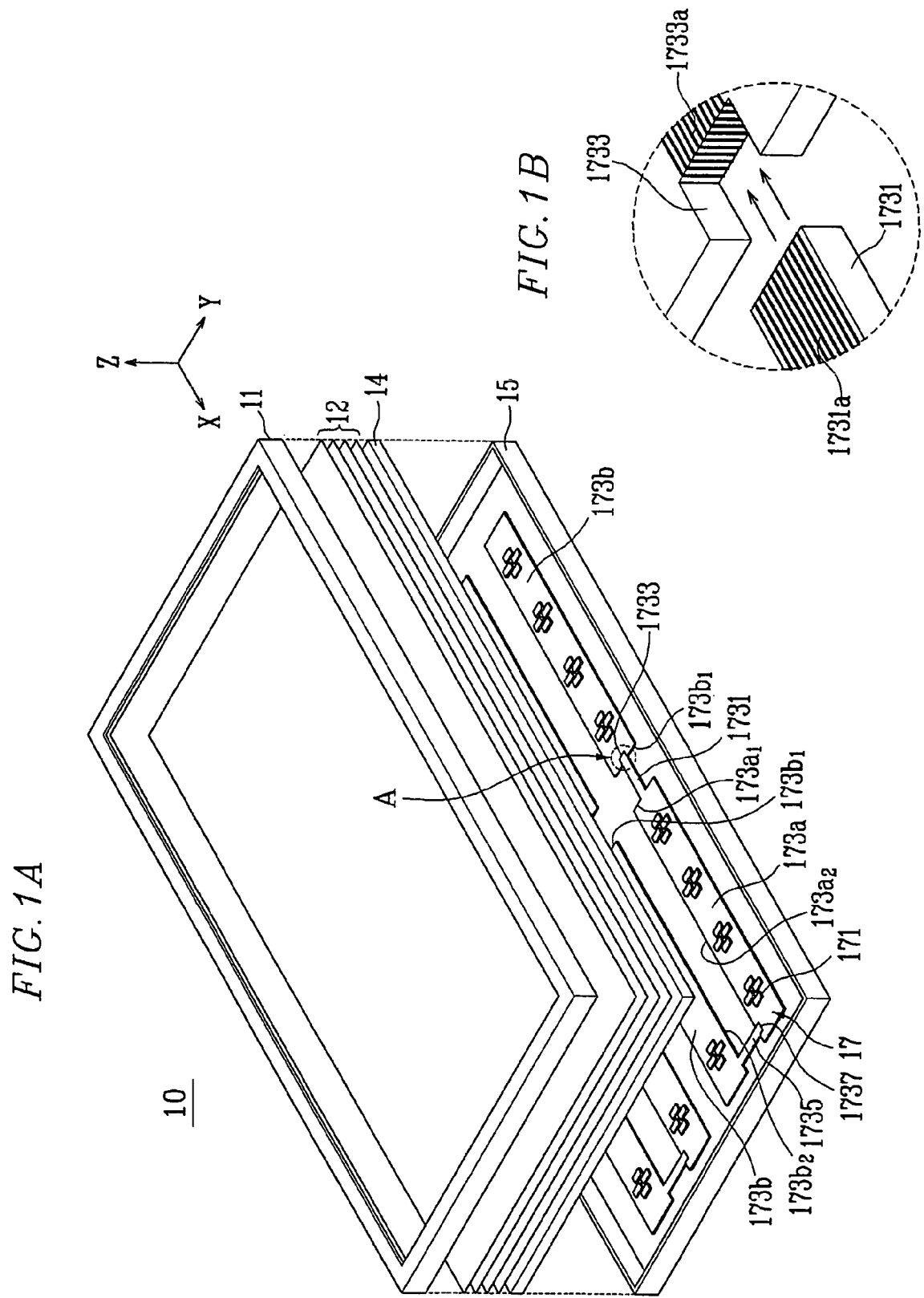

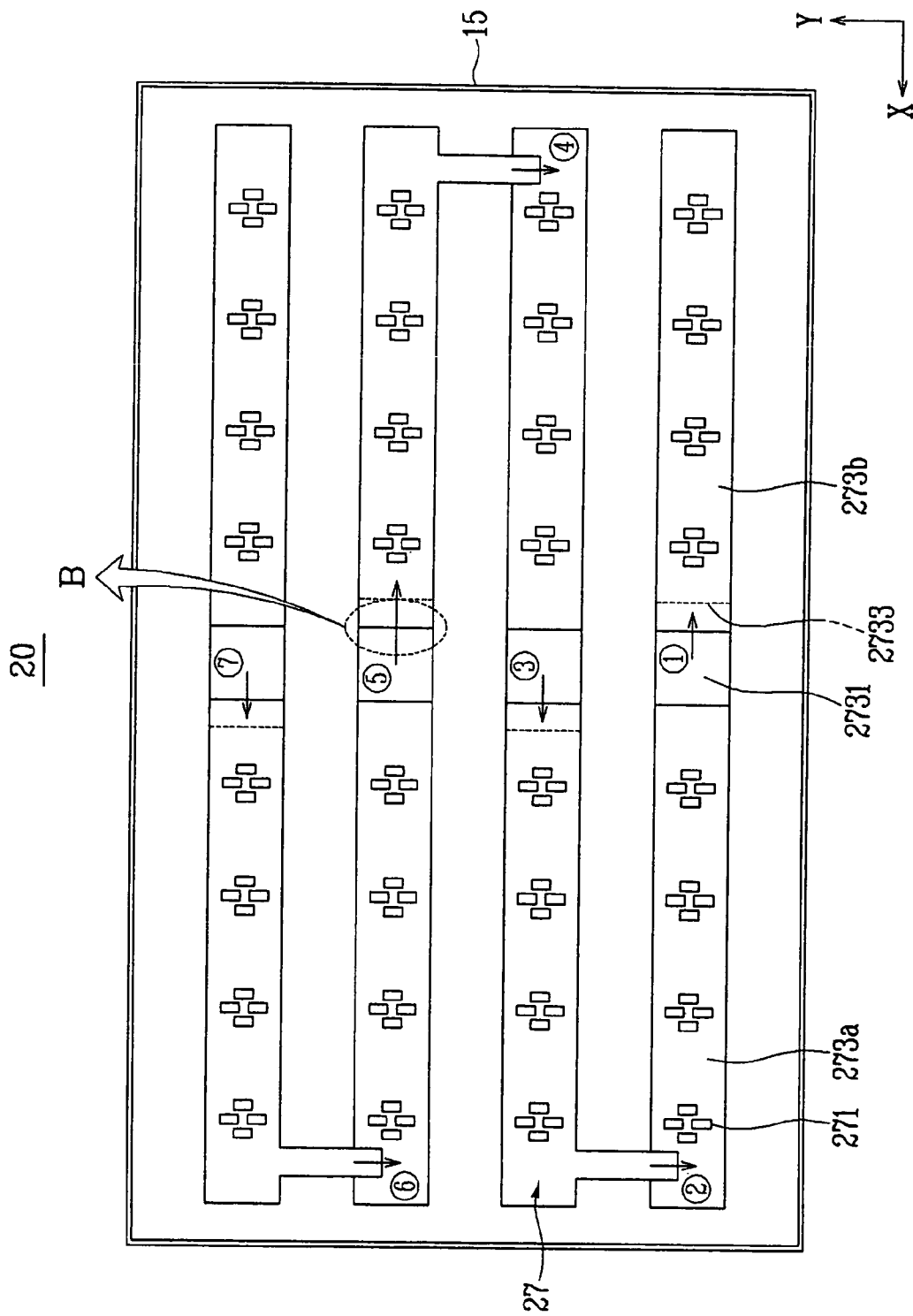

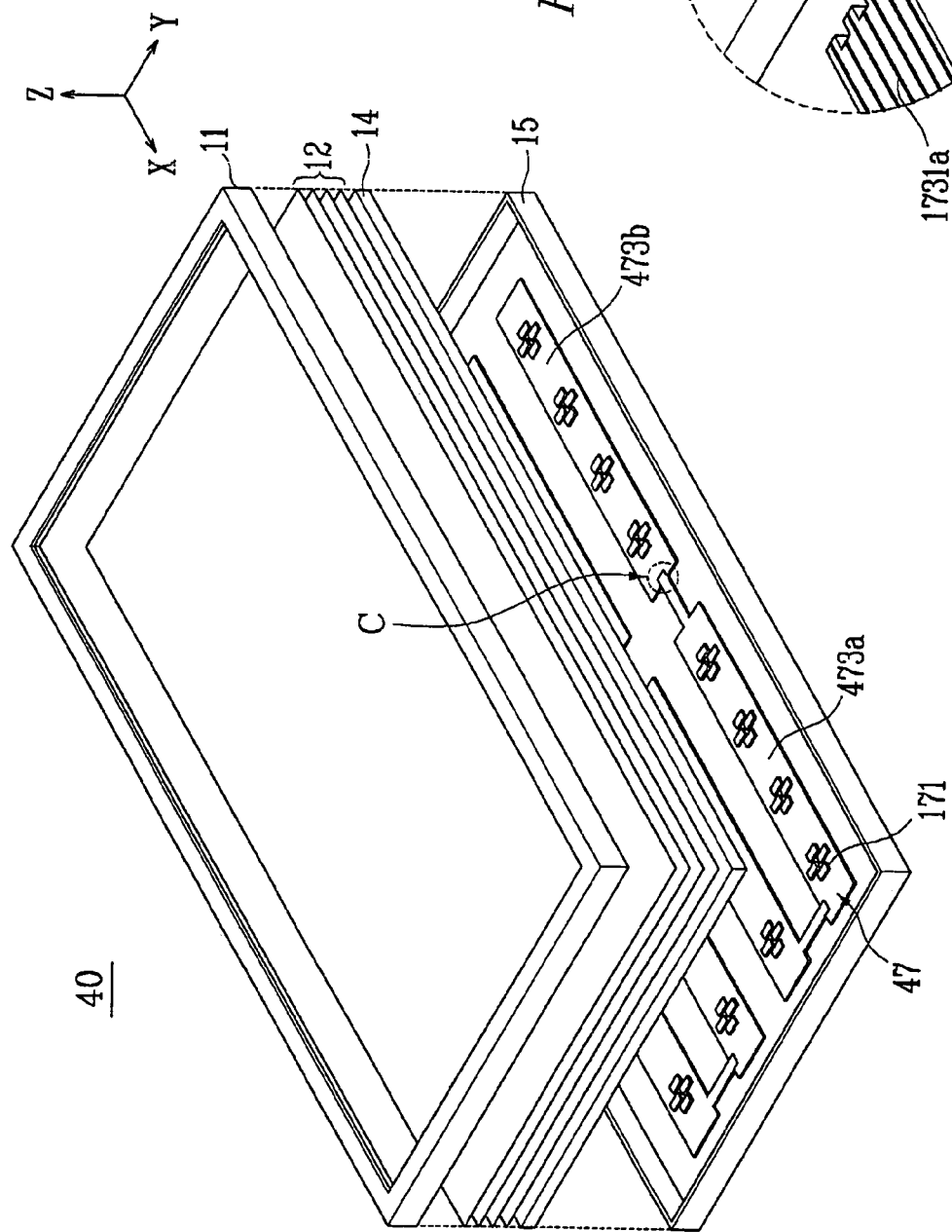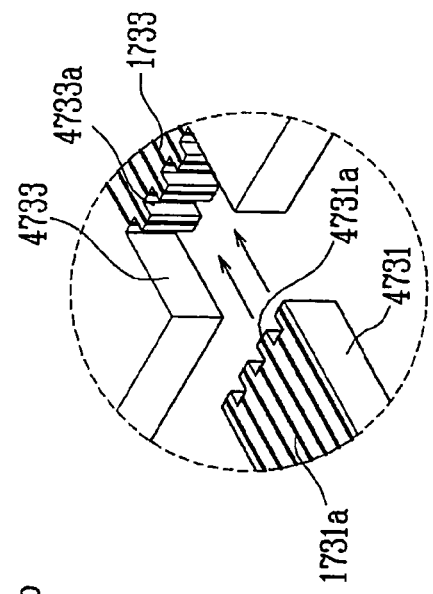

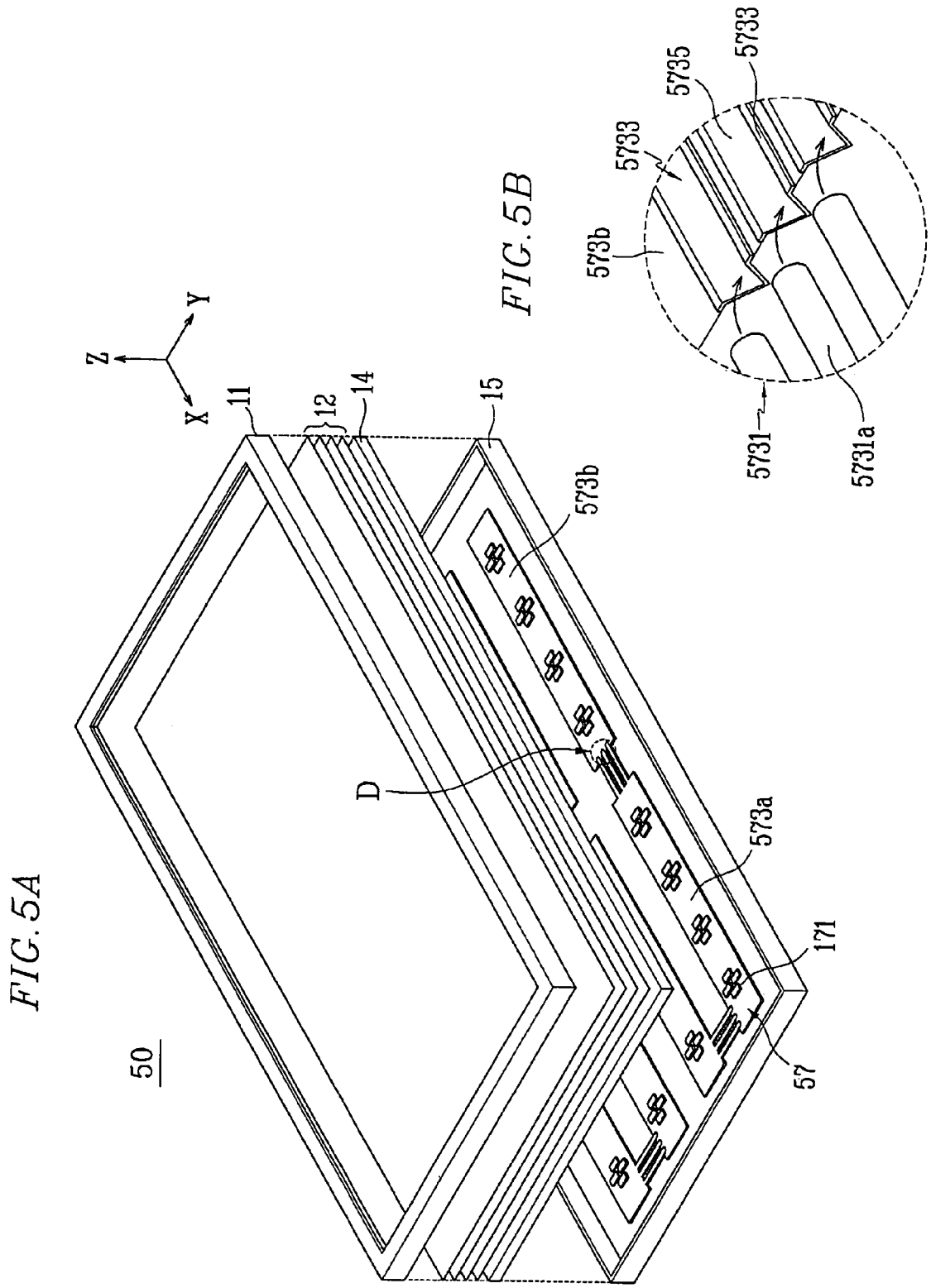

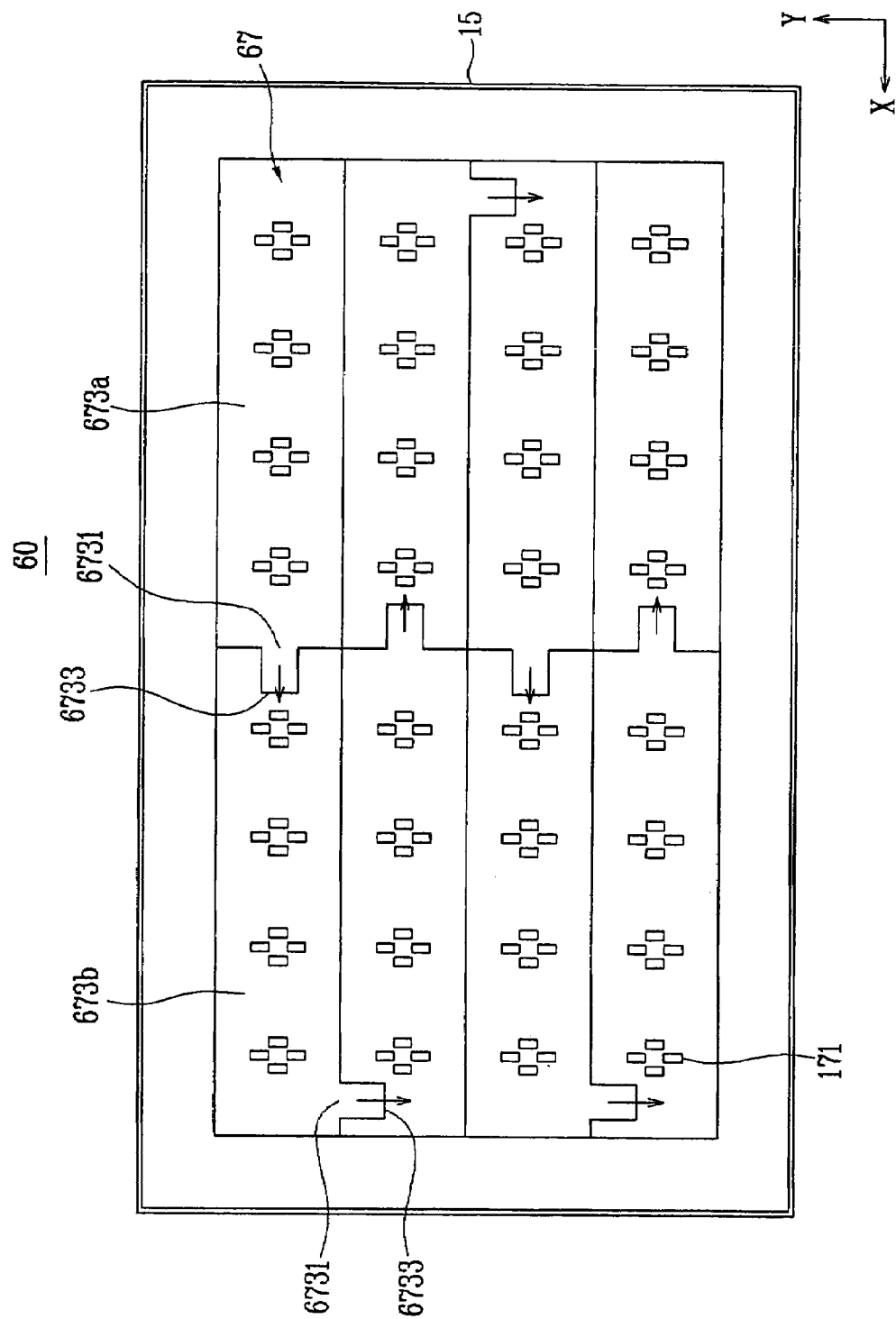

BACKLIGHT ASSEMBLY, DISPLAY DEVICE HAVING THE SAME, AND METHOD THEREOF

This application claims priority to Korean Patent Application No. 2005-0054002, filed on Jun. 22, 2005 and all the benefits accruing therefrom under 35 U.S.C. §119, and the contents of which in its entirety are herein incorporated by reference.

BACKGROUND OF THE INVENTION (a) Field of the Invention

The present invention relates to a backlight assembly, a display device having the backlight assembly, and a method thereof, and more particularly, the present invention relates to a backlight assembly with an improved connection structure of a metal core printed circuit board ("PCB"), a display device having the backlight assembly, and a method of assembling the backlight assembly.

(b) Description of the Related Art

As semiconductor techniques are rapidly developed, demands for lightweight, compact display devices has increased.

Examples of the display devices include liquid crystal display ("LCD") devices, plasma display panel ("PDP") devices, and organic light emitting display ("OLED") apparatuses.

Since such lightweight, compact display devices also display relatively clear images, these display devices have been gradually used as a substitute for a conventional cathode ray tube ("CRT"). Recently, these display devices have been used for display devices including TV sets, monitors, and mobile phones.

The LCD device cannot emit light by itself. The LCD device mainly includes an LCD panel and a backlight assembly for supplying light to the LCD panel. The backlight assembly includes a light source for emitting light. Examples of the light source include a cold cathode fluorescent lamp ("CCFL") and an external electrode fluorescent lamp ("EEFL"). Recently, instead of such lamps, a light emitting diode ("LED") has been used.

In general, LEDs are mounted on metal core printed circuit boards ("PCBs"). Conductive portions formed on the metal core PCBs are electrically connected to the LEDs to supply driving power thereto. In a backlight assembly using the LEDs, a plurality of the metal core PCBs are used. The metal core PCBs are connected to each other with connectors or cables.

When the metal core PCBs are connected to each other with cables, performing a connection process is time consuming, and interconnection is complicated, so that it is difficult to assemble the backlight assembly. In addition, rework for the backlight assembly is complicated, and, due to the connectors and cables, it is difficult to implement an entirely planarized light source.

Also, since the connectors and cables may deteriorate due to heat released from the light source, the performance of the backlight assembly is reduced. Furthermore, due to the connectors and cables, it is impossible to effectively use the light emitting from the light source.

BRIEF SUMMARY OF THE INVENTION

The present invention provides a backlight assembly having an improved connection structure of a metal core printed circuit board ("PCB").

The present invention also provides a display device having the backlight assembly.

According to exemplary embodiments of the present invention, there is provided a backlight assembly including a plurality of light sources emitting light, and a plurality of metal core PCBs on which the light sources are mounted, wherein the metal core PCBs are directly connected to each other in predetermined regions to emit light in a surface direction.

The metal core PCBs may include a plurality of first metal core PCBs having a convex portion provided on a first side surface of each first metal core PCB, and a plurality of second metal core PCBs having a concave portion provided on a first side surface of each second metal core PCB, and the convex and concave portions may be engaged with each other to electrically connect the first metal core PCBs to the second metal core PCBs.

In addition, the concave portion of each second metal core PCB may include an opening in a thickness direction of each second metal core PCB, or an opening in a direction parallel to a surface of each second metal core PCB.

Alternatively, the concave portion of each second metal core PCB may include grooves formed on a surface of each second metal core PCB. The convex and concave portions may be engaged with each other by overlaying the convex portions on respective concave portions. Each of the grooves may be constructed with a pair of slanted planes, and a distance between the slanted planes in each pair may increase in an upward direction of the second metal core PCB. A conductive portion may be formed on at least one of the slanted planes in each pair of slanted planes. Instead of slanted planes, each groove may be formed to have a curved surface.

A second side surface continuous with the first side surface of each first metal core PCB may be provided with a concave portion, and the concave portion formed on the second side surface of the first metal core PCB may have a substantially same shape as the concave portion formed on the first side surface of the second metal core PCB. In addition, a second side surface continuous with the first side surface of the second metal core PCB may be provided with a convex portion, and the convex portion formed on the second side surface of the second metal core PCB may have a substantially same shape as the convex portion formed on the first side surface of the first metal core PCB.

The first and second metal core PCBs may be sequentially and repetitively connected to each other, and connecting directions of the first and second metal core PCBs may sequentially intersect each other. The first and second metal core PCBs may be alternately connected to each other and arranged in a zigzag pattern.

A plurality of recesses may be formed at a distal end of each concave portion, and a plurality of protrusions may be formed at a distal end of each convex portion. The recesses and the protrusions may be engaged with each other.

Conductive portions may be formed on the concave and convex portions.

Lengths of the convex portions may be substantially equal to or larger than lengths of the concave portions.

The light sources may be light emitting diodes.

According to other exemplary embodiments of the present invention, there is provided a display device including a panel unit for display an image, and the above described backlight assembly.

According to other exemplary embodiments of the present invention, there is provided a method of assembling a backlight assembly, the backlight assembly including first and second metal core printed circuit boards each including light sources mounted thereon, the method including directly connecting the first metal core printed circuit boards to the second metal core printed circuit boards in absence of connectors and cables.

Directly connecting the first metal core printed circuit boards to the second metal core printed circuit boards may include inserting a convex portion of each of the first metal core printed circuit boards into a concave portion of each of the second metal core printed circuit boards. Directly connecting the first metal core printed circuit boards to the second metal core printed circuit boards may further include inserting a convex portion of each of the second metal core printed circuit boards into a concave portion of each of the first metal core printed circuit boards.

BRIEF DESCRIPTION OF THE DRAWINGS

The above and other features and advantages of the present invention will become more apparent by describing exemplary embodiments thereof with reference to the attached drawings in which:

FIG. 1A is an exploded perspective view of an exemplary backlight assembly according to a first exemplary embodiment of the present invention;

FIG. 1B is an enlarged view of portion A of FIG. 1A;

FIG. 2 is a plan view of an exemplary backlight assembly according to a second exemplary embodiment of the present invention;

FIG. 4A is an exploded perspective view of a portion of an exemplary backlight assembly according to a fourth exemplary embodiment of the present invention;

FIG. 4B is an enlarged view of portion C of FIG. 4A;

FIG. 5A is an exploded perspective view of a portion of an exemplary backlight assembly according to a fifth exemplary embodiment of the present invention;

FIG. 5B is an enlarged view of portion D of FIG. 5A;

FIG. 7 is a plan view of an exemplary backlight assembly according to a sixth exemplary embodiment of the present invention;

DETAILED DESCRIPTION OF THE INVENTION

Figure 3A:
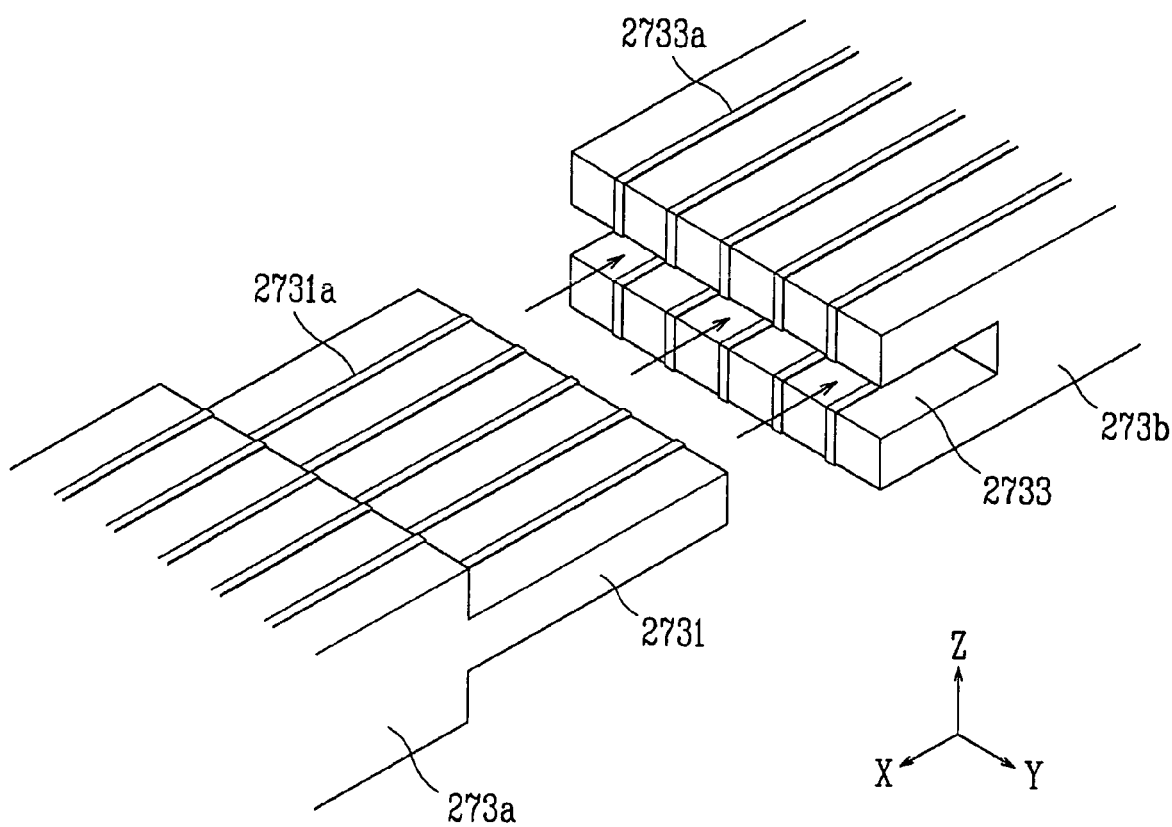
FIG. 3A is a schematic view of an exemplary assembling process for portion B of FIG. 2.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Now, exemplary embodiments of the present invention will be described with reference to FIGS. 1A to 10.

FIG. 1A shows an exploded perspective view of a backlight assembly 10 according to a first exemplary embodiment of the present invention. The backlight assembly 10 shown in FIG. 1A is a direct-lit type backlight assembly which may be used for a large-sized display device such as an LCD TV. It should be understood that the illustrated structure of the backlight assembly 10 shown in FIG. 1A is an exemplary one, and the present invention is not limited thereto. Therefore, other structures for the backlight assembly would also be within the scope of these embodiments.

The backlight assembly 10 includes a plurality of optical sheets 12, a diffuser plate 14, and a plurality of light source units 17. The backlight assembly 10 also includes a frame member 11 and a fixing member 15 for fixing the aforementioned components. That is, parts of the backlight assembly 10 are fixed by using the frame member 11 and the fixing member 15.

Each of the light source units 17 includes light sources 171 and metal core printed circuit boards ("PCBs") 173a and 173b for driving the light sources 171 mounted thereon. A plurality of the light source units 17 are accommodated in the fixing member 15. A plurality of the light source units 17 are arrayed in the X direction, that is, a longitudinal length of the light source units 17 extends in the X direction, which is substantially parallel to a long side of the fixing member 15, although other configurations would also be within the scope of these embodiments. Although not shown in FIG. 1A, an inverter (not shown) is disposed on a rear surface of the fixing member 15 to electrically connect the light source units 17. The inverters convert an external power into driving voltages and apply them to the light source units 17.

Light sources 171 constructed with light emitting diodes ("LEDs") are mounted on each of the light source units 17. A combination of red, green, blue, and white LEDs may be used. The structure of the light source is an exemplary one for the present invention, but the present invention is not limited thereto. Therefore, other structures may be used for the light source according to the present invention.

Light emitting from the light source units 17 pass through the diffuser plate 14 so as to be uniformly diffused. In order to prevent bright-line defects caused by the light source units 17, the diffuser plate 14 is disposed to be separated by a predetermined distance from the light source units 17. Light diffused by the diffuser plate 14 passes through a plurality of the optical sheets 12, so that brightness thereof increases. A prism sheet included in the optical sheets 12 improve straightness of light. A variety and number of optical sheets 12 may be used and the backlight assembly 10 should not be limited by the illustrated embodiment. As a result, uniform and highly-bright light can be supplied in an upward direction (Z direction in the figure) of the backlight assembly 10.

As shown in FIG. 1A, a plurality of the metal core PCBs 173a and 173b are directly connected to each other in predetermined regions of the fixing member 15. Namely, the metal core PCBs 173a and 173b are electrically connected to each other with direct connection without using connectors and cables. Therefore, assembling can be easily performed, so that it is possible to increase productivity. The metal core PCBs 173a and 173b are connected to each other to constitute substantially a surface-type light source. Therefore, the metal core PCBs 173a and 173b are used to emit light in a surface direction of the backlight assembly 10.

The metal core PCBs include a plurality of first metal core PCBs 173a and a plurality of second metal core PCBs 173b. In addition, other types of metal core PCBs may be included as needed. A first side surface $173a_1$ of the first metal core PCB 173a is provided with a convex portion 1731. A first side surface $173b_1$ of the second metal core PCB 173b is provided with a concave portion 1733. The convex portion 1731 and the concave portion 1733 are engaged with each other to electrically connect the first and the second metal core PCBs 173a and 173b.

A second side surface $173a_2$ continuous with the first side surface $173a_1$ of the first metal core PCB 173a is provided with a concave portion 1737. The first side surface $173a_1$ may be located on a short side of the first metal core PCB, while the second side surface $173a_2$ may be located on a long side of the first metal core PCB 173a. The first side surface $173a_1$ may extend in the Y direction and the second side surface $173a_2$ may extend in the X direction. The first metal core PCB 173a thus includes both the convex portion 1731 and the concave portion 1737. The concave portion 1737 formed on the second side surface $173a_2$ of the first metal core PCB 173a may have the same shape as the concave portion 1733 formed on the first side surface $173b_1$ of the second metal core PCB 173b. The convex portion 1731 and the concave portion 1737 may be formed adjacent first and second opposite ends of the first metal core PCB 173a.

In addition, a second side surface $173b_2$ continuous with the first side surface $173b_1$ of the second metal core PCB 173b is provided with a convex portion 1735. Therefore, the second metal core PCB 173b includes both the convex portion 1735 and the concave portion 1733. The convex portion 1735 formed on the second side surface $173b_2$ of the second metal core PCB 173b may have the same shape as the convex portion 1731 formed on the first side surface $173a_1$ of the first metal core PCB 173a. The concave portion 1733 and the convex portion 1735 may be formed adjacent first and second opposite ends of the second metal core PCB 173b.

By using the aforementioned structure, the first and second metal core PCBs 173a and 173b can be sequentially and repetitively connected to each other. Namely, first and second metal core PCBs 173a and 173b can be connected in a zigzag shape. Particularly, the convex portions 1731 and 1735 are designed to be longer than the concave portions 1733 and 1737, so that the metal core PCBs 173a and 173b can be electrically connected to each other but still be partially separated from each other along portions excluding the connecting portions. Due to the structure, the convex portions 1731 and 1735 can be easily detached from the concave portions 1733 and 1737. In addition, due to the structure, it is possible to obtain uniform brightness.

FIG. 1B shows an enlarged view of portion A of FIG. 1A and shows electrical connection between the metal core PCBs 173a and 173b. The convex portion 1731 moves in a direction as indicated by the arrows to be engaged with the concave portion 1733. In this example, the arrows extend in the X direction. The convex and concave portions 1733 and 1731 are engaged with each other to electrically connect the metal core PCBs 173a and 173b. Similarly, the convex portion 1735 may engage with the concave portion 1737 by moving in a direction towards the concave portion 1737, where that direction extends in the Y direction.

Conductive portions 1733a and 1731a are formed in the concave and convex portions 1733 and 1731, respectively. The conductive portions 1733a and 1731a may be formed on the metal core PCBs 173a and 173b in a patterned shape by using a sputtering process or the like. By using the conductive portions 1733a and 1731a, all of the first and second metal core PCBs 173a and 173b can be electrically connected and therefore be applied with power from an inverter.

The concave portion 1733 may be constructed by forming an opening in the second metal core PCB 173b in a thickness direction (Z-axis direction) thereof. The convex portion 1731 may be constructed by an injection molding process or a cutting process on the first metal core PCB 173a. Although not shown in FIGS. 1A and 1B, after the metal core PCBs 173a and 173b are engaged with each other, the metal core PCBs 173a and 173b may be securely fixed on the fixing member 15 with screws or the like.

FIG. 2 is a plan view showing an exemplary backlight assembly according to a second exemplary embodiment of the present invention. For convenience of illustration, a diffuser plate, optical sheets, and a frame member are not shown in FIG. 2, and only light source units 27 mounted on the fixing member 15 are shown. An arrayed shape of the light source units 27 shown in FIG. 2 is an exemplary one, and the present invention is not limited thereto. The light source units 27 may be arrayed in other shapes in alternative embodiments.

The light source units 27 include first metal core PCBs 273a and second metal core PCBs 273b. In the illustrated embodiment, each row of light source units 27 include a single first metal core PCB 273a and a single second metal core PCB 273b extending along a length of the fixing member 15 in the X direction. A convex portion 2731 formed in each first metal core PCBs 273a moves in a direction extending in the X direction, such as indicated by arrows 1, 3, 5, and 7, to be engaged with a concave portion 2733 formed in each second metal core PCB 273b. A convex portion formed in each second metal core PCB 273b moves in a direction extending in the Y direction, such as indicated by arrows 2, 4, and 6, to be engaged with a concave portion formed in each first metal core PCB 273a. In one exemplary embodiment, the convex portion formed in each second metal core PCB 273b may be substantially the same as the convex portion 1735 of FIG. 1A, and the concave portion formed in each first metal core PCB 273a may be substantially the same as the concave portion 1737 of FIG. 1A, such that the rows of light source units 27 are spaced from each other. By using a similar method, the engagement process repeats by alternately connecting the first metal core PCBs 273a and the second metal core PCBs 273b to each other in an order of directions 1 to 7, thereby all the light source units 27 can be engaged.

In this case, the connecting directions of the first and second metal core PCBs 273a and 273b sequentially intersect each other. Namely, the metal core PCBs 273a and 273b intersect and connect each other in the X-axis and Y-axis directions in a zigzag shape.

FIG. 3A shows an exemplary engagement process of portion B of FIG. 2. As shown in FIG. 3A, the concave portion 2733 is constructed by forming an opening in the second metal core PCB 273b in a direction parallel to a surface (XY plane) thereof. The concave portion 2733 extends between an upper surface and a lower surface of the second metal core PCB 273b. The convex portion 2731 moves in a direction as indicated by the arrows to be engaged with the concave portion 2733. Therefore, the first and second metal core PCBs 273a and 273b can be engaged with each other. The convex portion 2731 may be aligned with the concave portion 2733 such that, when engaged, an upper surface and a lower surface of each of the first and second metal core PCBs 273a and 273b are substantially co-planar, respectively. Conductive portions 2731a and 2733a are formed in the convex and concave portions 2731 and 2733, respectively, to be in contact with each other in the engagement process. Therefore, the first and second metal core PCBs 273a and 273b are electrically connected to each other to drive the light sources 271 shown in FIG. 2.

Figure 3B:
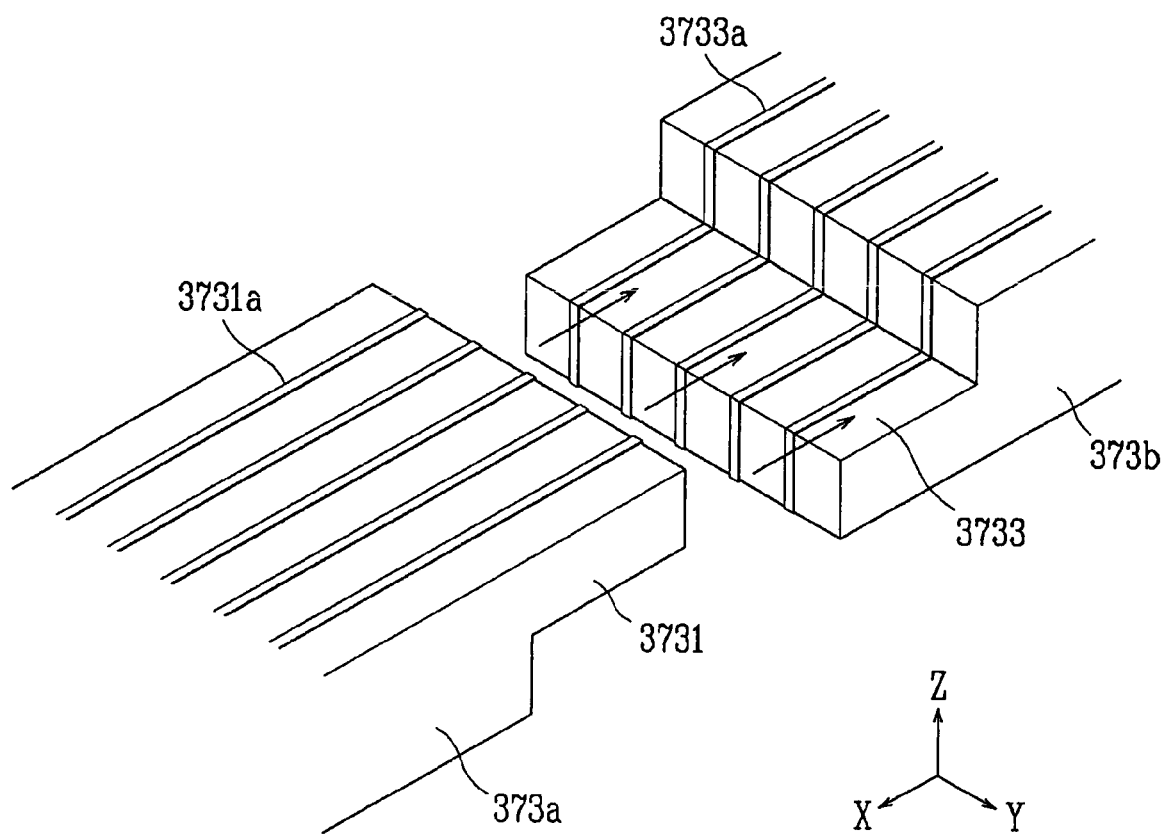
FIG. 3B is a schematic view of an exemplary assembling process for exemplary metal core printed circuit boards ("PCBs") included in an exemplary backlight assembly according to a third exemplary embodiment of the present invention.

FIG. 3B shows an exemplary assembling process for metal core PCBs 373a and 373b included in an exemplary backlight assembly according to a third exemplary embodiment of the present invention. As indicated by the arrows, convex and concave portions 3731 and 3733 are engaged with each other by overlaying the convex portion 3731 on the concave portion 3733. The convex portions 3731 may be formed by undercutting the first metal core PCB 373a, and the concave portions 3733 may be formed by over cutting the second metal core PCBs 373b. An upper portion of the convex portion 3731 is coplanar with an upper surface of the first metal core PCB 373a, but a lower portion of the convex portion 3731 is not coplanar with a lower surface of the first metal core PCB 373a. A lower portion of the concave portion 3733 is coplanar with a lower surface of the second metal core PCB 373b, but an upper portion of the concave portion 3733 is not coplanar with an upper surface of the second metal core PCB 373b. In another example of this embodiment, the first metal core PCB 373a may include the concave portion 3733 while the second metal core PCB 373b may include the convex portion 3731. Conductive portions 3731a and 3733a formed in the convex and concave portions 3731 and 3733, respectively, are in contact with each other to be electrically connected to each other.

FIG. 4A shows an exploded perspective view of a backlight assembly 40 according to a fourth exemplary embodiment of the present invention. The backlight assembly 40 according to the fourth exemplary embodiment of the present invention shown in FIGS. 4A and 4B is similar to the backlight assembly 10 according to the first exemplary embodiment of the present invention. Therefore, the same reference numerals denote the same elements, and detailed description of the same elements is omitted.

As shown in FIG. 4A, the backlight assembly 40 includes light source units 47 including first metal core PCBs 473a and second metal core PCBs 473b, both supporting light sources 171 thereon. Each row of light source units 47 extending in the X direction may include a first metal core PCB 473a and a second metal core PCB 473b which are connected to each other as will be further described below.

FIG. 4B shows an enlarged view of portion C of FIG. 4A. As shown in FIG. 4B, a convex portion 4731 of the first metal core PCB 473a and a concave portion 4733 of the second metal core PCB 473b are engaged with each other. Therefore, the plurality of light source units 47 are electrically connected to each other. A plurality of protrusions 4731a are formed at a distal end of the convex portion 4731, and a plurality of recesses 4733a are formed at a distal end of the concave portion 4733. The protrusions 4731a and recesses 4733a are engaged with each other, so that the first and second metal core PCBs 473a and 473b can be more securely engaged with each other. Conductive portions 1731a and 1733a are provided on the convex portion 4731 and concave portion 4733, respectively, similar to backlight assembly 10 of FIGS. 1A and 1B.

FIG. 5A shows an exploded perspective view of an exemplary backlight assembly according to a fifth exemplary embodiment of the present invention. The backlight assembly 50 according to the fifth exemplary embodiment of the present invention shown in FIGS. 5A and 5B is similar to the backlight assembly 10 according to the first exemplary embodiment of the present invention shown in FIG. 1. Therefore, the same reference numerals denote the same elements, and detailed description thereof is omitted.

As shown in FIG. 5A, the backlight assembly 50 includes light source units 57 including first metal core PCBs 573a and second metal core PCBs 573b, both supporting light sources 171 thereon. Each row of light source units 57 extending in the X direction may include a first metal core PCB 573a and a second metal core PCB 573b which are connected to each other as will be further described below.

FIG. 5B shows an enlarged view of portion D of FIG. 5A. As shown in FIG. 5B, a convex portion 5731 of the first metal core PCB 573a and a concave portion 5733 of the second metal core PCB 573b are engaged with each other. Therefore, the plurality of light source units 57 are electrically connected to each other. The convex portion 5731 may be formed to have a plurality of cylindrical portions. Conductive portions 5731a are formed on a surface of the cylindrical portions.

The concave portion 5733 is constructed with a plurality of grooves 5735 formed on a surface of the second metal core PCB 573b. Conductive portions 5733a are formed on the grooves 5735. The shape of the grooves 5735 shown in FIG. 5 is an exemplary embodiment of the present invention, but the present invention is not limited thereto. In alternative embodiments, the grooves 5735 may be formed in other shapes.

If the convex portion 5731 is overlaid on the concave portion 5733 in a direction as indicated by the arrows in FIG. 5B, the first and second metal core PCBs 573a and 573b are electrically connected to each other through the conductive portions 5731a and 5733a. Although not shown in FIGS. 5A and 5B, the light source units 57 may be securely fixed on the fixing member 15 with screws or the like. Therefore, by using the aforementioned engagement method, a reliability of electrical connection of the light source units 57 can be obtained.

Figure 6A:
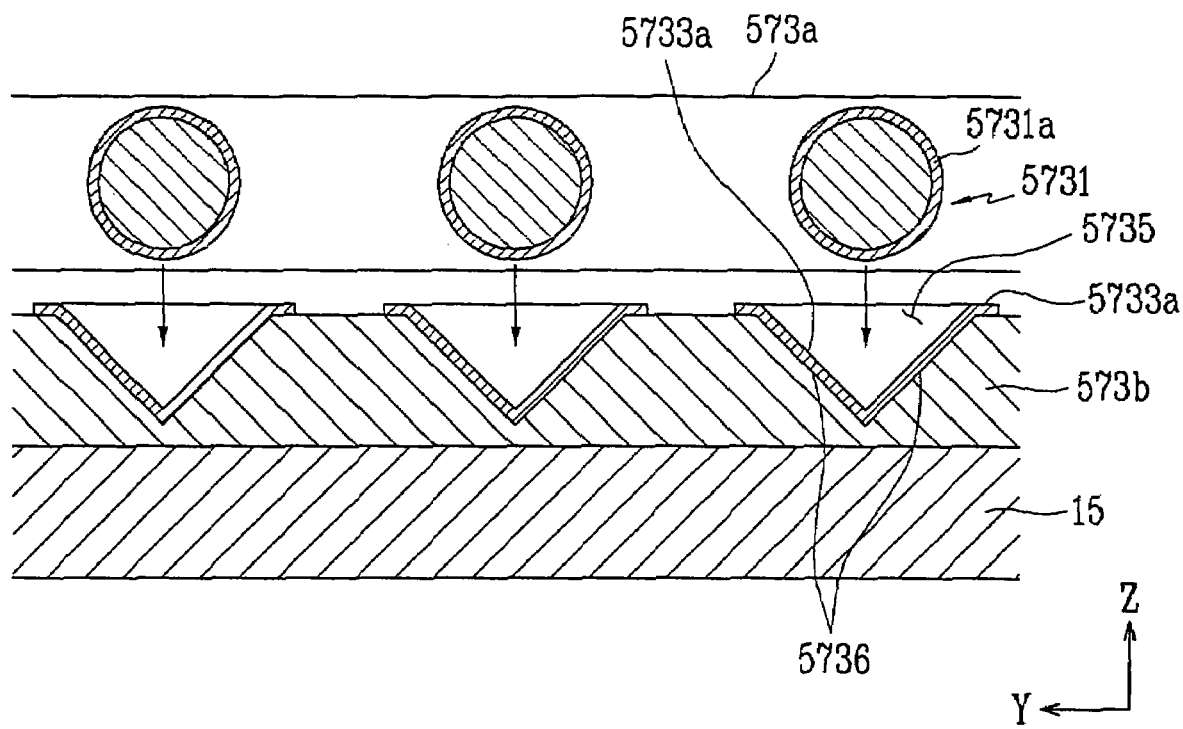
FIG. 6A is a cross sectional view of an exemplary assembling process for exemplary first and second metal core PCBs shown in FIG. 5.

FIG. 6A is a cross sectional view showing an exemplary assembling process for the exemplary first and second metal core PCBs 573a and 573b shown in FIG. 5B.

As shown in FIG. 6A, each of the grooves 5735 is constructed with a pair of slanted planes 5736. The pair of slanted planes 5736 are angularly disposed with respect to each other such that a distance between the slanted planes 5736 increases in the upward direction, i.e. the Z direction. Namely, the grooves 5735 have a V-shaped form. Since the grooves 5735 are formed on an upper surface of the second metal core PCB 573b, the distance between slanted planes 5736 gradually increases in the Z direction, such as toward the diffuser plate 14 disposed in the backlight assembly 50. Although the conductive portions 5733a are formed on both of the slanted planes 5736 in FIG. 6A, the conductive portions 5733a may be formed on at least one of the slanted planes 5736. Also, while the conductive portion 5731a is shown covering an entire cross-sectional periphery of the cylindrical portions of the convex portion 5731, the present invention is not limited thereto.

Figure 6B:
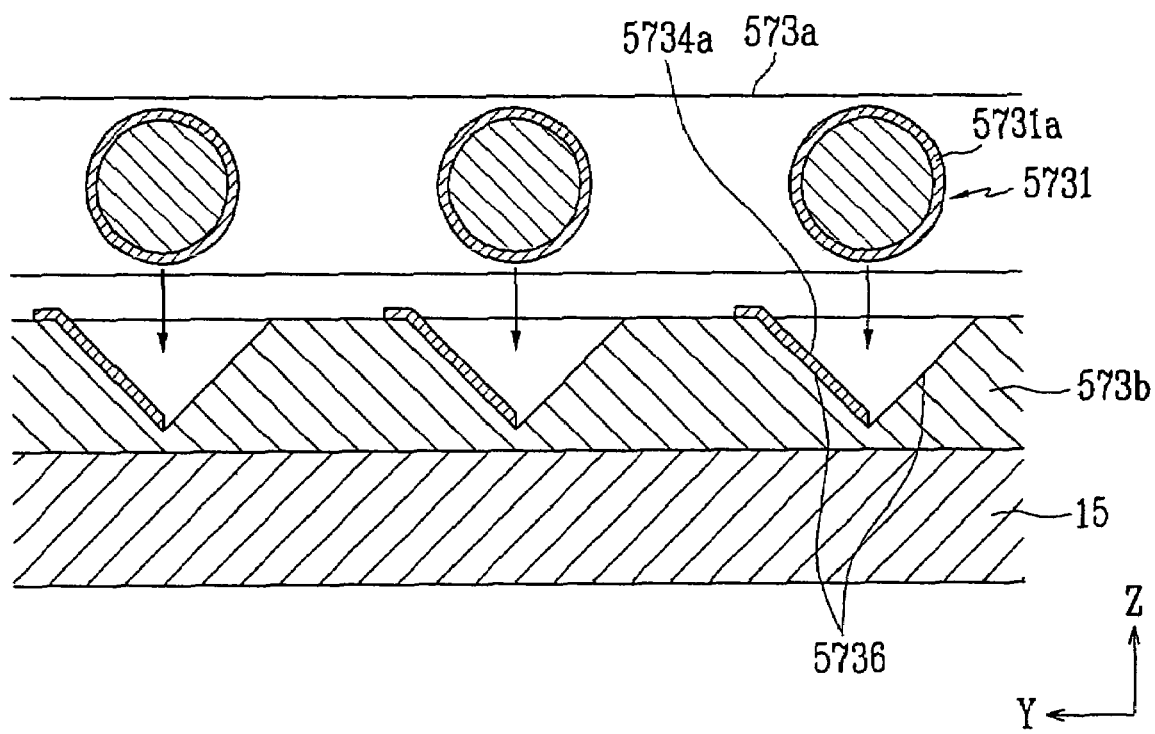
FIG. 6B is a cross sectional view of another example corresponding to FIG. 6A.

FIG. 6B is a cross sectional view showing another example of the second metal core PCB 573b corresponding to FIG. 6A. The cross sectional structure of the second metal core PCB 573b shown in FIG. 6B is similar to that of FIG. 6A. Therefore, the same reference numerals denote the same elements, and detailed description thereof is omitted.

As shown in FIG. 6B, the conductive portions 5734a are formed on only one slanted plane in a pair of the slanted planes 5736. Since the conductive portion 5731a formed on the entire surface of the cylindrical portions of the convex portion 5731 is in contact with the conductive portion 5734a, the reliability of electrical connection of the light source unit 57 can also be obtained.

Figure 6C:
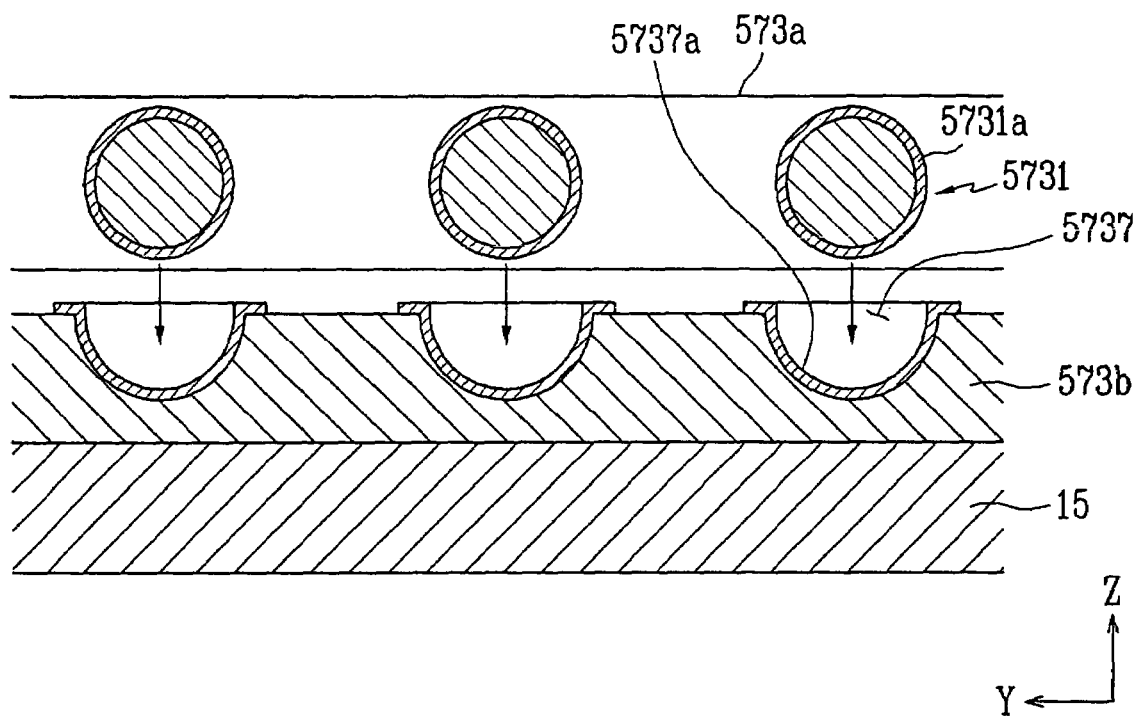
FIG. 6C is a cross sectional view of another example corresponding to FIG. 6A.

FIG. 6C is a cross sectional view showing another example of the second metal core PCB 573b corresponding to FIG. 6A. The cross sectional structure of the second metal core PCB 573b shown in FIG. 6C is similar to that of FIG. 6A. Therefore, the same reference numerals denote the same elements, and detailed description thereof is omitted.

As shown in FIG. 6C, the grooves 5737 are each formed to have a curved surface, such as a curved surface having a curvature corresponding to the curvature of the cylindrical portions of the convex portion 5731, so that the convex portion 5731 can be more securely engaged within the grooves 5737 of the concave portion of the second metal core PCB 573b. Conductive portions 5737a formed in the grooves 5737 are electrically connected to conductive portions 5731a formed on the cylindrical portions of the convex portion 5731. Therefore, the light source units 57 can be supplied with driving power.

FIG. 7 is a plan view of an exemplary backlight assembly according to a sixth exemplary embodiment of the present invention. For convenience of illustration, a diffuser plate, optical sheets, and a frame member are not shown in FIG. 7, and only light source units 67 mounted on the fixing member 15 are shown. An arrayed shape of the light source units 67 shown in FIG. 7 is an exemplary one, and the present invention is not limited thereto. In alternative embodiments, the light source units 67 may be arrayed in other shapes.

The backlight assembly 60 includes first metal core PCBs 673a alternately arranged with second metal core PCBs 673b, and light sources 171 provided thereon. As shown with arrows, eight light source units 67 are engaged to each other to constitute a surface-type light source. Although eight light source units 67 are shown in FIG. 7, the number of the light source units 67 is an exemplary one, and the present invention is not limited thereto. Therefore, in alternative embodiments, other numbers of the light source units 67 may be used.

The first metal core PCBs 673a include a convex portion 6731 located on a first side, a short side adjacent a first end, of the first metal core PCB 673a, and a concave portion 6733 located on a second side, a long side adjacent a second end, of the first metal core PCB 673a. The second metal core PCBs 673b include a concave portion 6733 located on a first side, a short side adjacent a first end, of the second metal core PCB 673b, and a convex portion 6731 located on a second side, a long side adjacent a second end, of the second metal core PCB 673b. Since lengths of the convex portions 6731 are equal to those of the concave portions 6733, the metal core PCBs 673a and 673b are engaged to be adjacent to each other. Therefore, gaps are not formed between the metal core PCBs 673a and 673b. In this manner, a securely-assembled surface-type light source can be implemented.

Figure 8:
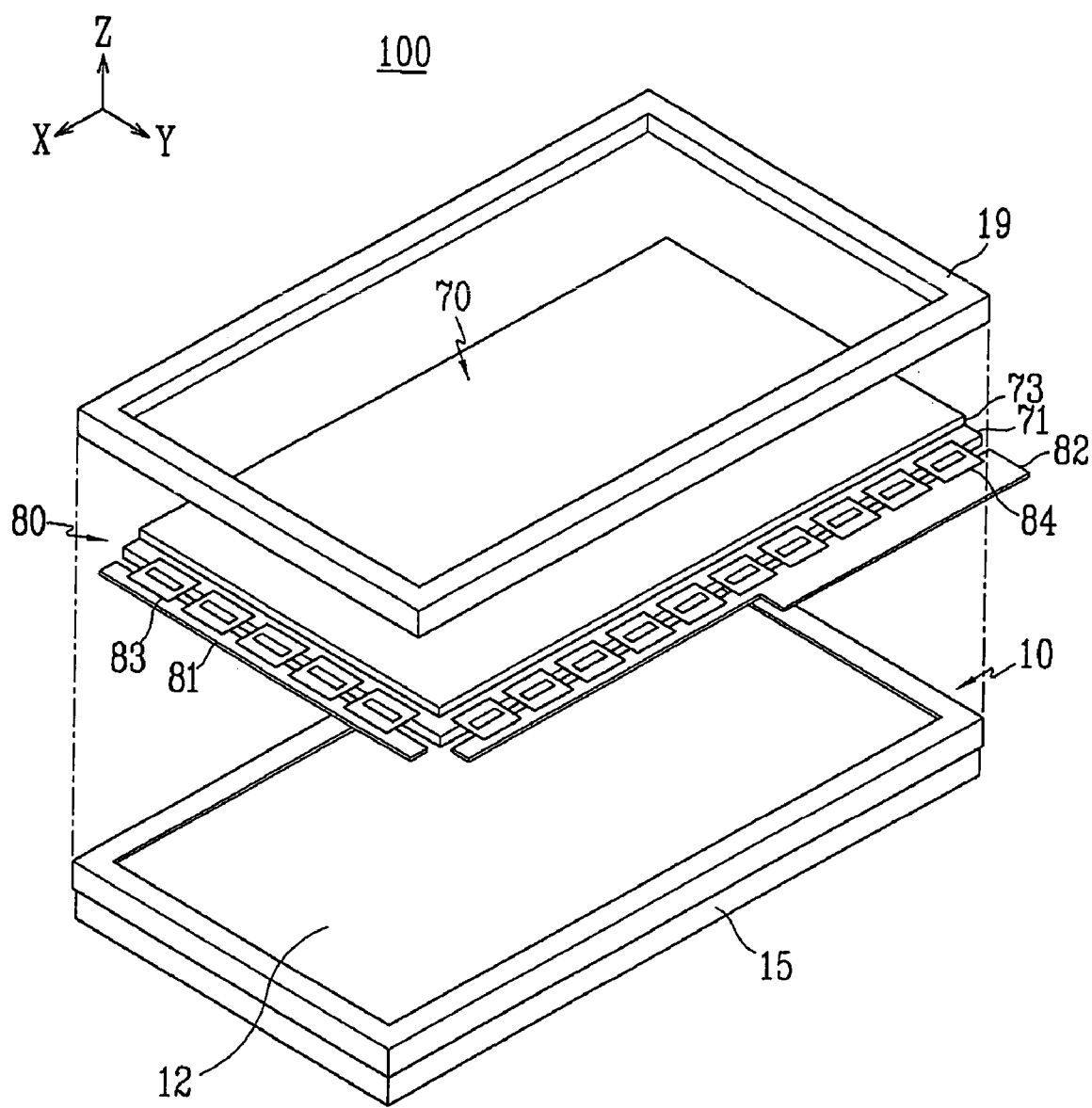
FIG. 8 is an exploded perspective view of an exemplary display device having the exemplary backlight assembly according to the first exemplary embodiment of the present invention.

FIG. 8 shows a display device 100 having the backlight assembly 10 according to the first exemplary embodiment of the present invention. Although FIG. 8 shows the backlight assembly 10 shown in FIG. 1, the backlight assembly is an exemplary one of the present invention, and the present invention is not limited thereto. Therefore, the exemplary backlight assemblies according to the second to sixth exemplary embodiments of the present invention can also be used for the display device.

The panel unit 70 may employ a liquid crystal display ("LCD") panel. The LCD panel is an exemplary one of the present invention, and the present invention is not limited thereto.

The display device 100 includes the panel unit 70 and the backlight assembly 10. The panel unit 70 is securely fixed on the backlight assembly 10 by using a frame member 19. A panel unit assembly 80 includes the panel unit 70, driver integrated circuit ("IC") packages 83 and 84, and PCBs 81 and 82. As an example of the driver IC packages, chip on film ("COF"), tape carrier package ("TCP"), or the like may be used. The PCBs 81 and 82 may be enclosed within a side surface of another frame member 19.

The panel unit 70 includes a thin film transistor ("TFT") panel 71 including a plurality of TFTs, a color filter panel 73 disposed over the TFT panel 71, and a liquid crystal layer 3 (FIG. 10) containing liquid crystal molecules (not shown) injected between the panels 71 and 73. Polarizing plates may be attached on an upper portion of the color filter panel 73, and a lower portion of the TFT panel 71 to polarize light passing through the panel unit 70.

The TFT panel 71 includes a transparent substrate, such as glass, where the TFTs are disposed in a matrix configuration. A source port (source electrode) of each TFT is connected to a data line, and a gate port (gate electrode) thereof is connected to a gate line. A drain port of each TFT is connected to a pixel electrode made of a transparent conductive material such as, but not limited to, indium tin oxide ("ITO").

When electric signals of gate and data PCBs 81 and 82 are input to the gate and data lines of the panel unit 70, the electric signals are transmitted to the gate and source ports of the TFTs. According to the input of the electric signals, the TFTs turns on or off, so that an electric signal for forming an image is output to the drain ports thereof.

The color filter panel 73 is disposed to face the TFT panel 71. The color filter panel 73 is a panel where red, green, blue RGB filters 230 (FIG. 10) are formed by using a thin film formation process. The RGB filters 230 represent predetermined colors when light passes through the filters. A common electrode made of, for example, ITO is disposed on the entire surface, or substantially the entire surface, of the color filter panel 73. When a power is supplied to the gate and source ports to turn on the TFTs, an electric field is generated between the pixel electrodes of the TFT panel 71 and the common electrode of the color filter panel 73. Due to the electric field, alignment angles of the liquid crystal molecules of the liquid crystal layer 3 injected between the TFT panel 71 and the color filter panel 73 change, so that transmittance of light changes. As a result, a desired image can be obtained.

The gate and data PCBs 81 and 82 which receive external image signals and apply driving signals to the gate and data lines are connected to gate and data driver IC packages 83 and 84 attached to the panel unit 70. In order to drive the display device 100, the gate PCB 81 transmits gate driving signals, and the data PCB 82 transmits data driving signals. Namely, the gate and data driving signals are applied through the gate and data driver IC packages 83 and 84 to the gate and data lines of the panel unit 70. A control board (not shown) is disposed on a rear surface of the backlight assembly 10. The control board is connected to the data PCB 82 to convert analog data signals to digital data signals and apply the digital data signals to the panel unit 70.

Figure 9:
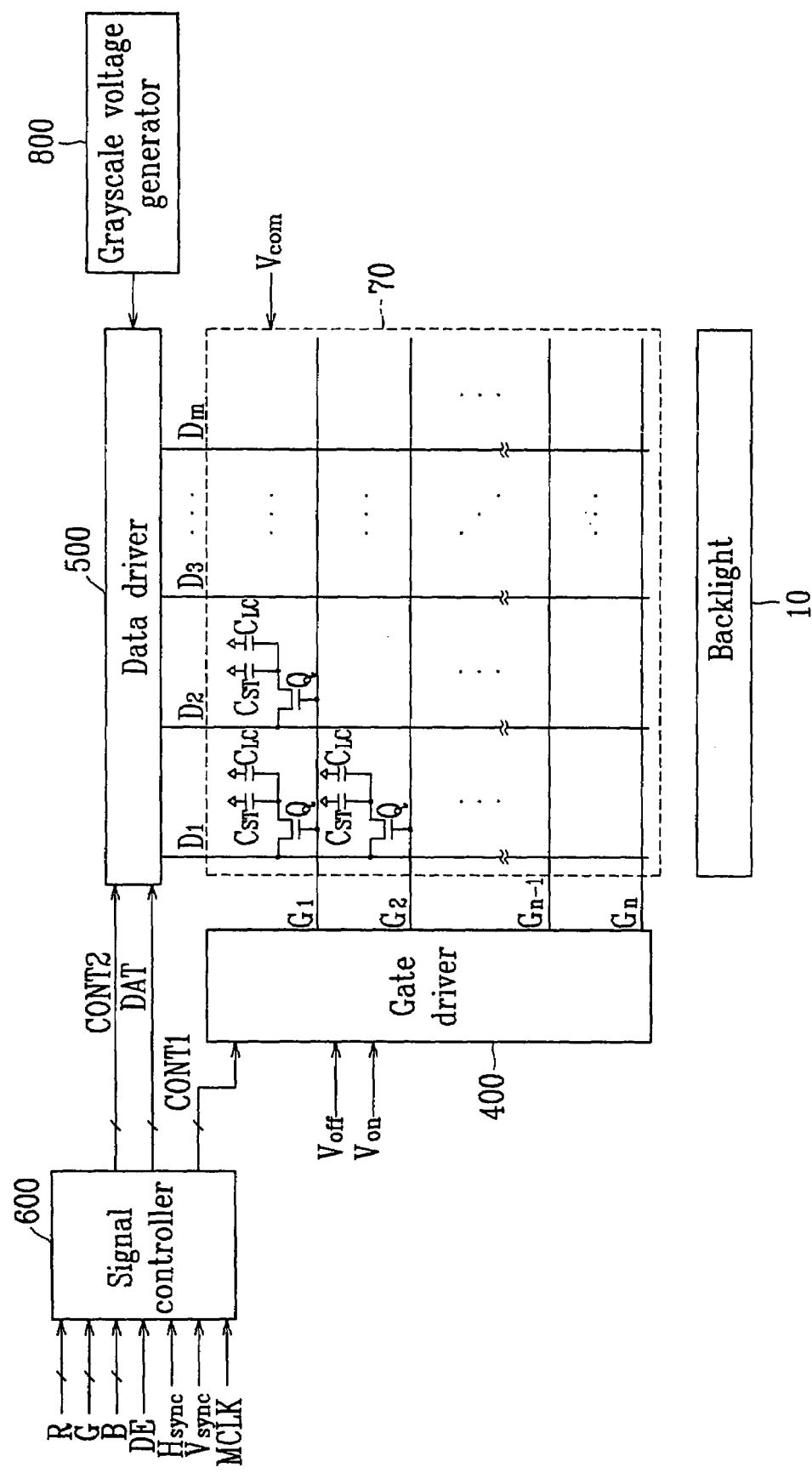
FIG. 9 is a block diagram of exemplary elements for driving the exemplary panel unit included in the exemplary display device of FIG. 8.
Figure 10:
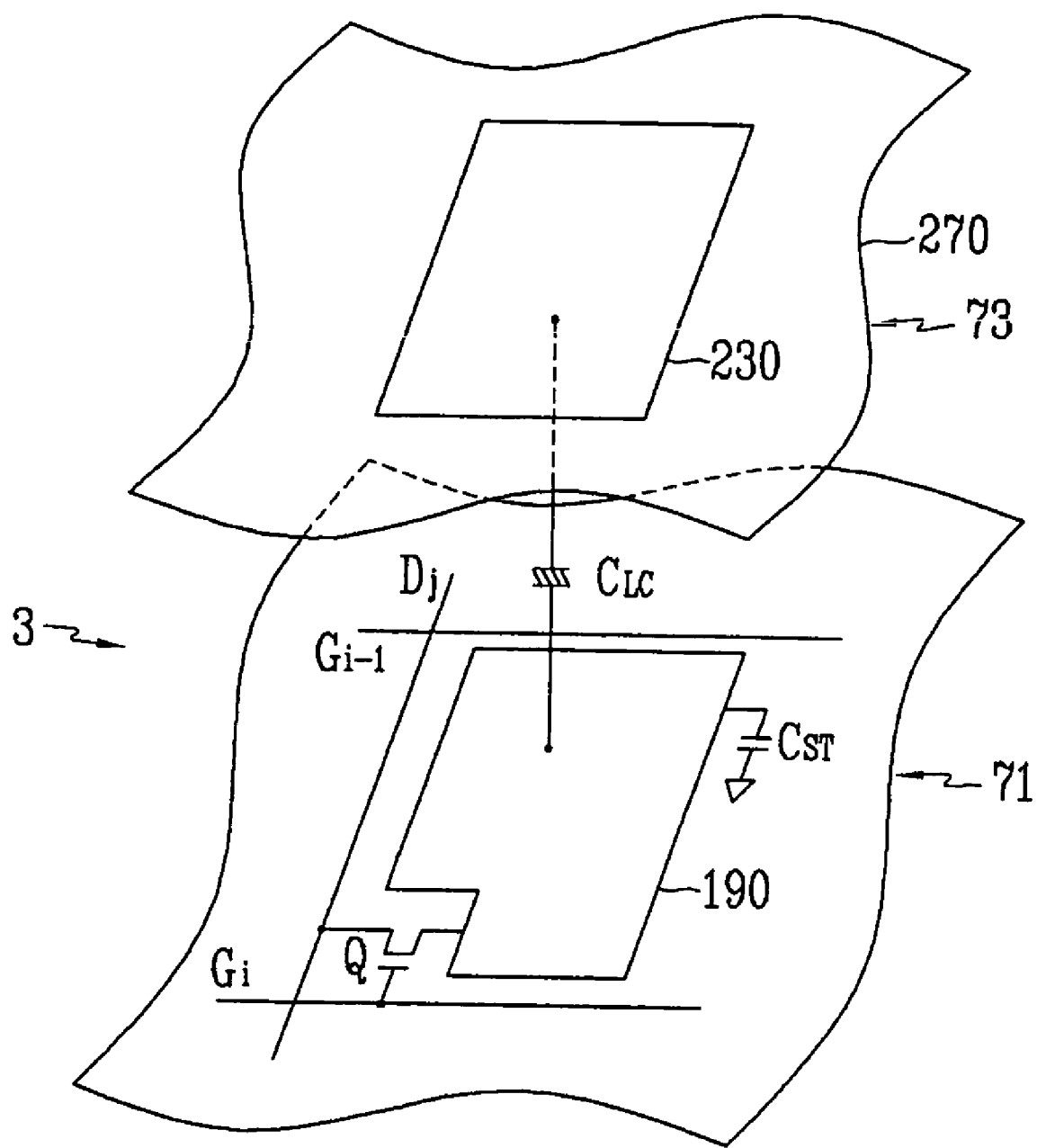
FIG. 10 is an equivalent circuit diagram of an exemplary pixel of the exemplary panel unit.

Now, operations of the panel unit 70 will be further described with reference to FIGS. 9 and 10.

The TFT panel 71 includes a plurality of display signal lines $G_1$ to $G_n$ and $D_1$ to $D_m$. The TFT panel 71 also includes a plurality of pixels PX which are connected to a plurality of the display signal lines $G_1$ to $G_n$ and $D_1$ to $D_m$ and arrayed substantially in matrix.

The display signal lines $G_1$ to $G_n$ and $D_1$ to $D_m$ include a plurality of gate lines $G_1$ to $G_n$ for transmitting gate signals (sometimes, referred to as a "scan signal") and a plurality of data lines $D_1$ to $D_m$ for transmitting data signals. The gate lines $G_1$ to $G_n$ extend in parallel to each other substantially in a row direction, a first direction, and the data lines $D_1$ to $D_m$ extend in parallel to each other substantially in a column direction, a second direction substantially perpendicular to the first direction.

Each of the pixels PX includes a switching device Q connected to the display signal lines $G_1$ to $G_n$ and $D_1$ to $D_m$, a liquid crystal capacitor $C_{LC}$ connected thereto, and a storage capacitor $C_{ST}$. The storage capacitor $C_{ST}$ may be omitted as needed.

The switching devices Q is a three-port device such as a TFT disposed in the TFT panel 71 and having a control port (gate electrode) connected to one of the gate lines $G_1$ to $G_n$ an input port (source electrode) connected to one of the data lines $D_1$ to $D_m$, and an output port (drain electrode) connected to the liquid crystal capacitor $C_{LC}$ and the storage capacitor $C_{ST}$.

Two ports of the liquid crystal capacitor $C_{LC}$ are a pixel electrode 190 of the TFT panel 71 and a common electrode 270 of the color filter panel 73, and the liquid crystal layer 3 interposed between the two electrodes 190 and 270 serves as a dielectric member. The pixel electrode 190 is connected to the switching device Q, and the common electrode 270 is disposed within the entire surface, or at least substantially the entire surface, of the color filter panel 73 to receive a common voltage $V_{com}$. In an alternative embodiment, the common electrode 270 may be disposed on the TFT panel 71, and in this case, at least one of the two electrodes 190 and 270 may be formed in a shape of line or bar.

The storage capacitor $C_{ST}$ having an auxiliary function for the liquid crystal capacitor $C_{LC}$ is constructed by overlapping a separate signal line (not shown) and the pixel electrode 190 provided to the TFT panel 71 with an insulating member interposed there between, and a predetermined voltage such as the common voltage $V_{com}$ is applied to the separate signal line. However, alternatively, the storage capacitor $C_{ST}$ may be constructed by overlapping the pixel electrode 190 and a front gate line disposed just above with an insulating member interposed there between.

The signal controller 600 receives input image signals R, G, and B and input control signals for controlling display thereof from an external graphic controller (not shown). As an example of the input control signals, there are a vertical synchronization signal Vsync, a horizontal synchronization signal Hsync, a main clock MCLK, and a data enable signal DE. The signal controller 600 processes the input image signals R, G, and B according to an operating condition of the panel unit 70 based on the input control signals and the input image signals R, G, and B to generate a gate control signal CONT1, a data control signal CONT2, and the like. The signal controller 600 then transmits the generated gate control signal CONT1 to the gate driver 400 and the generated data control signal CONT2 and the processed image signal DAT to the data driver 500.

The gate control signal CONT1 includes a scan start signal STV for indicating output start of the gate-on voltage $V_{on}$ and at least one clock signal for controlling an output period of the gate-on voltage $V_{on}$ and an output voltage.

The data control signal CONT2 includes a horizontal synchronization start signal STH for indicating transmission start of the image data DAT, a load signal LOAD for commanding to apply the associated data voltages to the data lines $D_1$ to $D_m$, and a data clock signal HCLK. The data control signal CONT2 also includes an inversion signal RVS for inverting a voltage polarity of the data signal with respect to the common voltage $V_{com}$ (hereinafter abbreviated to a "data signal polarity").

In addition to the control signals CONT1 and CONT2, the signal controller 600 may transmit to the backlight assembly 10 other control signals and clock signals for controlling the operations of the backlight assembly 10.

In response to the data control signal CONT2 from the signal controller 600, the data driver 500 sequentially receives and shifts the digital image data DAT for one pixel row and selects the grayscale voltages corresponding to the digital image data DAT from the grayscale voltages supplied by the grayscale voltage generator 800, so that the image data DAT are converted into the associated data voltages. After that, the data voltages are applied to the associated data lines $D_1$ to $D_m$.

The gate driver 400 applies the gate-on voltage $V_{on}$ to the gate lines $G_1$ to $G_n$ according to the gate control signals CONT1 from the signal controller 600 to turn on the switching devices Q connected to the gate lines $G_1$ to $G_n$. As a result, the data voltages applied to the data lines $D_1$ to $D_m$ are applied to the associated pixels PX through the turned-on switching devices Q.

A difference between the data voltages applied to the pixel PX and the common voltage $V_{com}$ becomes a charge voltage of the liquid crystal capacitors $C_{LC}$, that is, a pixel voltage. Alignment of the liquid crystal molecules within the liquid crystal layer 3 varies according to the intensity of the pixel voltage.

In units of one horizontal period (or 1 H), that is, one period of the horizontal synchronization signal Hsync, the data deriver 500 and the gate driver 400 repetitively perform the aforementioned operations for the next pixel. In this manner, during one frame, the gate-on voltages $V_{on}$ are applied to all the gate lines $G_1$ to $G_n$, so that the data voltages are applied to all the pixels. When one frame ends, the next frame starts, and a state of the inversion signal RVS applied to the data driver 500 is controlled, so that the polarity of the data signal applied to each of the pixels is opposite to the polarity in the previous frame (frame inversion). At this time, even in one frame, according to the characteristics of the inversion signals RVS, the polarity of the data signal flowing through the one data line may be inverted (row inversion and dot inversion). In addition, the polarities of the data signals applied to the one pixel row may be different form each other (column inversion and dot inversion).

In the display device having the aforementioned structure, the light source units can be extracted from the backlight assembly of the display device without entirely dismantling the display device. As a result, the tasks of repairing and rework of the light source units can be easily performed.

According to exemplary embodiments of the present invention, since a plurality of metal core PCBs are connected to each other in predetermined regions of a backlight assembly, there is no need for cables and connectors for the backlight assembly. Therefore, the backlight assembly can be easily assembled, so that productivity thereof can increase.

In addition, since convex and concave portions formed in first and second metal core PCBs are engaged with each other, it is possible to implement a securely-engaged connection structure.

Also, since a concave portion is constructed with grooves formed on a surface of a metal core PCB, the concave can be easily produced.

Furthermore, since a plurality of recesses formed at a distal end of a concave portion are engaged with a plurality of protrusions formed at a distal end of a convex portion, it is possible to implement a securely-engaged connection structure.

Since conductive portions formed on the concave and convex portions are in contact with each other, a reliability of electrical connection of the light source units can be obtained.

Although the exemplary embodiments and the modified examples of the present invention have been described, the present invention is not limited to the embodiments and examples, but may be modified in various forms without departing from the scope of the appended claims, the detailed description, and the accompanying drawings of the present invention. Therefore, it is natural that such modifications belong to the scope of the present invention.

What is claimed is:

1. A backlight assembly comprising:
a plurality of light sources emitting light; and
a plurality of metal core printed circuit boards on which the light sources are mounted, the metal core printed circuit boards including connecting portions adjacent first and second longitudinal ends of the metal core printed circuit boards,
wherein the metal core printed circuit boards are directly connected to each other by the connecting portions to emit light in a surface direction, and the metal core printed circuit boards are not otherwise connected to each other except at the connecting portions adjacent the first and second longitudinal ends thereof,
wherein the metal core printed circuit boards include:
a plurality of first metal core printed circuit boards having a first connecting portion including a convex portion provided on a first side surface of each first metal core printed circuit board, wherein the convex portion has a plurality of protrusions and a plurality of recesses formed at a distal end of the convex portion; and
a plurality of second metal core printed circuit boards having a first connecting portion including a concave portion provided on a first side surface of each second metal core printed circuit board, wherein the concave portion has a plurality of protrusions and a plurality of recesses formed at a distal end of the concave portion, and
wherein the protrusions and the recesses of the convex portion and the recesses and the protrusions of the concave portion engage with each other to electrically connect the first metal core printed circuit board to the second metal core printed circuit boards.

2. The backlight assembly of claim 1, wherein the concave portion of each second metal core printed circuit board includes an opening in a thickness direction of each second metal core printed circuit board.

3. The backlight assembly of claim 1, wherein the concave portion of each second metal core printed circuit board includes an opening formed in a direction parallel to a surface of each second metal core printed circuit board.

4. The backlight assembly of claim 1, wherein lengths of the convex portions are substantially equal to lengths of the concave portions.

5. The backlight assembly of claim 1, wherein the light sources are light emitting diodes.

6. The backlight assembly of claim 1, wherein adjacent metal core printed circuit boards are spaced from each other except at the connecting portions adjacent the first and second longitudinal ends thereof.

7. The backlight assembly of claim 1, wherein the concave portion of each second metal core printed board includes grooves formed on a surface of each second metal core printed circuit board.

8. The backlight assembly of claim 7, wherein the convex and concave portions are engaged with each other by overlaying the convex portions on respective concave portions.

9. The backlight assembly of claim 7, wherein each groove is formed to have a curved surface.

10. The backlight assembly of claim 7,
wherein each of the grooves is constructed with a pair of slanted planes, and
wherein a distance between the slanted planes in each pair increases in a surface direction of the second metal core printed circuit board.

11. The backlight assembly of claim 10, wherein a conductive portion is formed on at least one of the slanted planes in each pair of slanted planes.

12. The backlight assembly of claim 1, wherein a second side surface continuous with the first side surface of each first metal core printed circuit board is provided with a second connecting portion including a concave portion.

13. The backlight assembly of claim 12, wherein the concave portion formed on the second side surface of each first metal core printed circuit board has substantially a same shape as the concave portion formed on the first side surface of each second metal core printed circuit board.

14. The backlight assembly of claim 12, wherein a second side surface continuous with the first side surface of each second metal core printed circuit board is provided with a second connecting portion including a convex portion.

15. The backlight assembly of claim 14, wherein the convex portion formed on the second side surface of the second metal core printed circuit board has substantially a same shape as the convex portion formed on the first side surface of each first metal core printed circuit board.

16. The backlight assembly of claim 14, wherein the first and second metal core printed circuit boards are sequentially and repetitively connected to each other.

17. The backlight assembly of claim 16, wherein the first and second metal core printed circuit boards are alternately connected to each other and arranged in a zigzag pattern.

18. The backlight assembly of claim 16, wherein connecting directions of the first and second metal core printed circuit boards sequentially intersect each other.

19. The backlight assembly of claim 1, wherein conductive portions are formed on the concave and convex portions.

20. The backlight assembly of claim 19, wherein the conductive portions are formed in at least some of the protrusions and the recesses.

21. A backlight assembly comprising:
a plurality of light sources emitting light; and
a plurality of metal core printed circuit boards on which the light sources are mounted, the metal core printed circuit boards including:
   a plurality of first metal core printed circuit boards having a convex portion provided on a first side surface of each first metal core printed circuit board; and
   a plurality of second metal core printed circuit boards having a concave portion provided on a first side surface of each second metal core printed circuit board,
wherein the convex and concave portions are engaged with each other to electrically connect the first metal core printed circuit boards to the second metal core printed circuit boards to emit light in a surface direction, and lengths of the convex portions are substantially larger than lengths of corresponding concave portions.

22. A display device comprising:
a panel unit displaying an image;
a plurality of light sources supplying light to the panel unit; and
a plurality of metal core printed circuit boards on which the light sources are mounted, the metal core printed circuit boards including connecting portions adjacent first and second longitudinal ends of the metal core printed circuit boards,
wherein the metal core printed circuit boards are directly connected to each other by the connecting portions to emit light in a surface direction, and the metal core printed circuit boards are not otherwise connected to each other except at the connecting portions adjacent the first and second longitudinal ends thereof,
wherein the metal core printed circuit boards include:
   a plurality of first metal core printed circuit boards having a first connecting portion including a convex portion provided on a first side surface of each first metal core printed circuit board, wherein the convex portion has a plurality of protrusions and a plurality of recesses formed at a distal end of the convex portion; and
   a plurality of second metal core printed circuit boards having a first connecting portion including a concave portion provided on a first side surface of each second metal core printed circuit board, wherein the concave portion has a plurality of protrusions and a plurality of recesses formed at a distal end of the concave portion, and
   wherein the protrusions and the recesses of the convex portion and the recesses and the protrusions of the concave portion engaged with each other to electrically connect the first metal core printed circuit board to the second metal core printed circuit boards.

23. The display device of claim 22, wherein conductive portions are formed on the concave and convex portions.

24. The display device of claim 22, wherein the concave portion of each second metal core printed circuit board includes grooves formed on a surface of each second metal core printed circuit board.

25. The display device of claim 24, wherein the convex and concave portions are engaged with each other by overlaying the convex portions on respective concave portions.

26. The display device of claim 22, wherein a second side surface continuous with the first side surface of each first metal core printed circuit board is provided with a concave portion.

27. The display device of claim 26, wherein a second side surface continuous with the first side surface of each second metal core printed circuit board is provided with a convex portion.

28. The display device of claim 26, wherein the first and second metal core printed circuit boards are sequentially and repetitively connected to each other.

29. The display device of claim 28, wherein connecting directions of the first and second metal core printed circuit boards sequentially intersect each other.

* * * * *